United States Patent
Jung et al.

(10) Patent No.: US 9,228,891 B2
(45) Date of Patent: Jan. 5, 2016

(54) LIGHT TO FREQUENCY CONVERTER OPTICAL SENSOR WITH ELECTRONIC BIAS AND ADJUSTABLE GAIN

(71) Applicants: Wayne D Jung, Morton Grove, IL (US); Russell W Jung, Morton Grove, IL (US); Alan R Loudermilk, Marshall, TX (US)

(72) Inventors: Wayne D Jung, Morton Grove, IL (US); Russell W Jung, Morton Grove, IL (US); Alan R Loudermilk, Marshall, TX (US)

(73) Assignee: SPECTRAL SENSORS INC., Marshall, TX (US)

( * ) Notice: Subject to any disclaimer, the term of this patent is extended or adjusted under 35 U.S.C. 154(b) by 0 days.

(21) Appl. No.: 14/217,270

(22) Filed: Mar. 17, 2014

(65) Prior Publication Data
US 2015/0260570 A1    Sep. 17, 2015

Related U.S. Application Data

(60) Provisional application No. 61/852,136, filed on Mar. 15, 2013.

(51) Int. Cl.
*H01J 40/14* (2006.01)
*G01J 1/44* (2006.01)
*H03M 1/18* (2006.01)

(52) U.S. Cl.
CPC ... *G01J 1/44* (2013.01); *H03M 1/18* (2013.01)

(58) Field of Classification Search
CPC ............... H03M 1/18; G02F 1/00; G02F 7/00
USPC ............. 250/214 R, 214 C, 214 DC, 214 SW, 250/214 LS, 214 AG; 341/13, 118, 137
See application file for complete search history.

(56) References Cited

U.S. PATENT DOCUMENTS 5,850,195 A * 12/1998 Berlien et al. ................ 341/137
6,635,859 B2 * 10/2003 Wiles, Jr. .................... 250/214.1

* cited by examiner

*Primary Examiner* — Kevin Pyo
(74) *Attorney, Agent, or Firm* — Loudermilk & Associates

(57) ABSTRACT

An improved light to frequency converter optical sensor and method using electronic bias. Adjustable gain also may be provided. A summing circuit sums electrical current from a photo detector and electrical current from a bias current circuit and provides the summed current to an integrator. A threshold detector comparator circuit has an input coupled to the output of the integrator and an output providing a series of pulses. The series of pulses has a frequency based on the light received by the photo detector and the electrical current from the bias current circuit.

2 Claims, 4 Drawing Sheets

LIGHT TO FREQUENCY CONVERTER OPTICAL SENSOR WITH ELECTRONIC BIAS AND ADJUSTABLE GAIN

This application claims priority on U.S. Provisional App. Ser. No. 61/852,136, filed Mar. 15, 2013.

FIELD OF THE INVENTION

The present invention relates to optical sensors, and more particularly to a light to frequency converter optical sensor-based systems and methods utilizing electronic bias and adjustable gain in such systems.

BACKGROUND OF THE INVENTION

Light to frequency converters (LFCs) are used to measure the intensity of light. Generally, such optical sensors consist of an electronic circuit having a photo detector and a current (or voltage) to frequency converter. FIG. 1 is a block diagram of a typical light to frequency converter. The photo detector produces a voltage or a current. The current (or voltage) to frequency converter produces a frequency that generally is proportional to the light intensity detected or received by the photo detector. As illustrated in FIG. 1, light input 2 couples received light to photo detector 4, which is coupled via line 6 to current to frequency converter 8, which outputs on line 10 a signal having a frequency that is proportional to the light intensity detected by photo detector 4.

Typical photo detectors are photo-transistors or photo diodes that are implemented with a suitable power source to produce a current, or photo cells that produce both a current and a voltage. In either case, whether the photo detector produces a voltage or current the principals of operation of the light to frequency converter in general are the same.

FIG. 2 is a typical current to frequency converter. As illustrated, it consists of integrator 14 that integrates the input current on line 12 (or voltage used to produce a current), threshold detector comparator 18 coupled to integrator 14 that detects when integrator 14 reaches a threshold level and a discharge circuit (preferably internal to integrator 14 and not separately shown) coupled via line 20 that resets integrator 14 when the integrator output reaches the threshold level. The frequency of the pulses produced by threshold detector comparator 18 (LFC output) on output line 22 in general are proportional to the intensity of the input current on line 12. As the current is increased the output frequency is increased.

Light to frequency converters have been commercially available for several decades. Two suppliers are Texas Advanced Optical Systems and Hamamatsu.

The inventors have disclosed methods for measuring the output of light to frequency converters (see, e.g., U.S. application Ser. No. 09/091,208, filed on Jun. 8, 1998, which is based on International Application No. PCT/US97/00126, filed on Jan. 2, 1997, which is a continuation in part of U.S. application Ser. No. 08/581,851, now U.S. Pat. No. 5,745,229, issued Apr. 28, 1998, for Apparatus and Method for Measuring Optical Characteristics of an Object; U.S. application Ser. No. 9/091,170, filed on Jun. 8, 1998, which is based on International Application No. PCT/US97/00129, filed on Jan. 2, 1997, which is a continuation in part of U.S. application Ser. No. 08/582,054, now U.S. Pat. No. 5,759,030 issued Jun. 2, 1998, for Apparatus and Method for Measuring Optical Characteristics of Teeth; PCT Application No. PCT/US98/13764, filed on Jun. 30, 1998, which is a continuation in part of U.S. application Ser. No. 08/886,223, filed on Jul. 1, 1997, for Apparatus and Method for Measuring Optical Characteristics of an Object; PCT Application No. PCT/US98/13765, filed on Jun. 30, 1998, which is a continuation in part of U.S. application Ser. No. 08/886,564, filed on Jun. 30, 1998, for Apparatus and Method for Measuring Optical Characteristics of Teeth; and U.S. application Ser. No. 08/886,566, filed on Jul. 1, 1997, for Method and Apparatus for Detecting and Preventing Counterfeiting. Reference is also made to PCT App. Ser. No. PCT/US03/05310 filed on Feb. 21, 2003, which is a continuation in part of U.S. App. Ser. No. 10/081,879, filed on Feb. 21, 2002; the foregoing patent documents are sometimes referenced collectively herein as the "Referenced Patent Documents" and are incorporated herein by reference for their use of LFCs in various circuits, systems, methods and applications).

One method is to count the number of output pulses for a fixed period of time. The number of pulses is proportional to the light intensity. Unfortunately, this method produces low grayscale photonic resolution when light intensities are low because the intensity range may only produce a limited number of pulses. When a LFC is utilized in a spectroscopy application where multiple LFCs receive a limited range of light wavelengths, the intensity is further reduced. Another disadvantage of counting the output pulses is that there is a minimum light intensity threshold needed to produce a single pulse in the measurement light period. If the intensity is too low, an intensity measurement cannot be made.

As disclosed in the Referenced Patent Documents, a preferred method to measure the output of an LFC is to both count the number of output pulses for a fixed time period and also measure the amount of time that elapsed between the first pulse and last pulse in the measurement time period. The intensity of the LFC is then calculated by dividing the number of pulses by time elapsed between the first and last pulse and reporting the quotient as a floating point number. As long as there are two or more pulses the light intensity can be measured and the grayscale photonic resolution is independent of light intensity. The grayscale resolution is determined by the resolution of the timing clock measuring the time between the first and last pulse.

1. LFC Intensity (Number of Pulses)/(Time Between First and Last Pulse)

However, there is a minimum intensity required to produce a measurement since at least two pulses are needed to determine the time between the first and last pulse. As disclosed in the Referenced Patent Documents, in one preferred arrangement the LFC can be biased by a stable light source to ensure a minimum threshold is present. When the sample light source is applied, the output of the LFC will be the sum of the bias intensity and the light source intensity. As long as the bias light source is stable (or otherwise monitored) it can be subtracted from the LFC output to determine the intensity of the unknown light source.

2. Intensity=Intensity of Sample−Intensity of Bias

Providing a bias light source increase circuit complexity and costs. Accordingly, there is a need for improved optical sensors, and more particularly there is a need for improved light to frequency converter optical sensor-based systems and methods utilizing electronic bias and adjustable gain in such systems.

SUMMARY OF THE INVENTION

The present invention provides an improved light to frequency converter optical sensor having electronic bias and preferably having adjustable gain. In accordance with the present invention, a current to frequency converter has a current input from a bias current circuit and a current input from a photo detector, which preferably are summed by a summing circuit. The current input from the bias current circuit provides an electronic bias to the current to frequency converter. When there is no light input to the photo detector, the photo detector provides a minimal current such that a predetermined minimum frequency of output pulses are generated by the current to frequency converter. The electronic bias is set to cause the current to frequency converter to maintain a minimal frequency output to ensure that measurements can be made at minimal light intensities. The minimal frequency can be considered a pseudo dark frequency. The current input receives bias current from any known bias current circuit, which are known to those of skill in the art.

The bias current is adjustably provided by a bias circuit and can be increased or decreased under CPU control (see the Referenced Patent Documents) to ensure the LFC m preferably produces at least two output pulses during the measurement time interval. As the time interval is decreased for more rapid measurements, the current preferably is increased. Similarly, as the time interval is decreased for slower measurement rates, the current preferably is decreased. In preferred embodiments, light intensity measurements are made by determining the measurement rate and adjusting the bias current to produce at least two output pulses from the LFC in a desired measurement time interval. The sample light source is turned off preferably under CPU control (see the Referenced Patent Documents) and the output of the LFC is measured with only the bias current. The sample light source is then applied and the output of the LFC is measured. The light intensity of the sample light source is then determined by subtracting the bias frequency as shown in equation 2 above.

The light source photo detector preferably has an electronic switch that permits the output from the photo detector to be enabled or disabled (i.e., switched) from the current to frequency detector. The switch allows the electronic bias to be measured independently of the photo detector without gating the sample light source off with an external circuit. Measurements may be made in rapid succession by gating the photo detector off, measuring the bias current, gating the photo detector on and then measuring both the bias and photo detector current and subtracting the bias frequency as disclosed in equation 2 above.

In alternative preferred embodiments, the integrator in the current to frequency converter has an adjustable gain that can be electronically controlled preferably by varying the feedback capacitance by applying additional capacitance to the feedback loop under CPU control. By varying the integrator gain, the output frequency of the light to frequency converter system can be lowered to prevent saturation of the frequency counters under high light intensity situations or raised when light intensities are low.

Accordingly, it is an object of the present invention to provide an improved light to frequency converter optical sensor having electronic bias.

It is another object of the present invention to provide an improved light to frequency converter optical sensor having electronic bias and adjustable gain.

It is yet another object of the present invention to provide an improved optical sensor and improved optical sensing methods that may be integrated to form spectrometer, spectrophotometer or other spectral sensing or color measurement devices.

It further is an object of the present invention to provide an optical sensor that may be used in the same manner as the LFC type optical sensors as described in the Referenced Patent Documents.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

The present invention will be described in greater detail with reference to certain preferred and alternative embodiments of systems and methods in accordance with the present invention. As described below, refinements and substitutions of the various embodiments are possible based on the principles and teachings herein.

As previously above and in the Referenced Patent Documents, light bias can desirably be utilized with light to frequency converters. When utilizing light bias to extend the range of light intensities that can be measured with light to frequency converters, however, it typically is necessary to measure the intensity of the light bias. It also typically is necessary to maintain a light bias that is stable during the measurement process or to independently monitor the bias intensity while measuring the unknown light intensity. This can be achieved with an additional sensor independently measuring bias or it can be achieved by making two measurements in rapid succession by gating the sample light off and measuring the bias only then applying the sample light and measuring both the bias and sample light intensity. This adds circuit complexity and costs.

Figure 1:
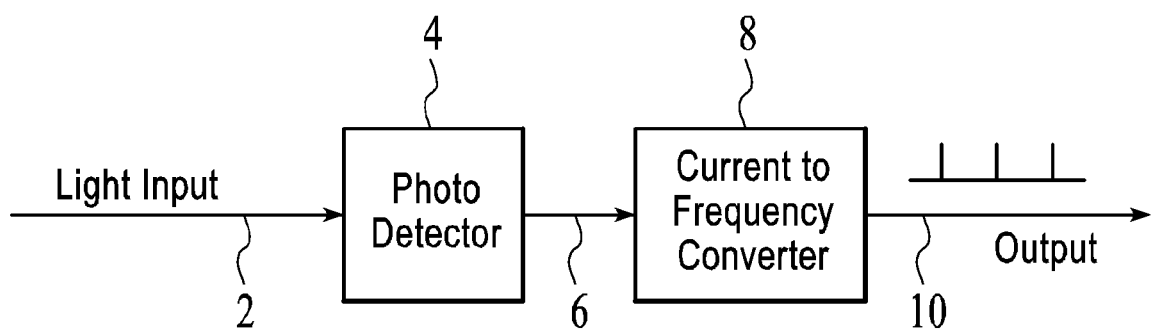
FIG. 1 is a block diagram of a typical light to frequency converter.
Figure 2:
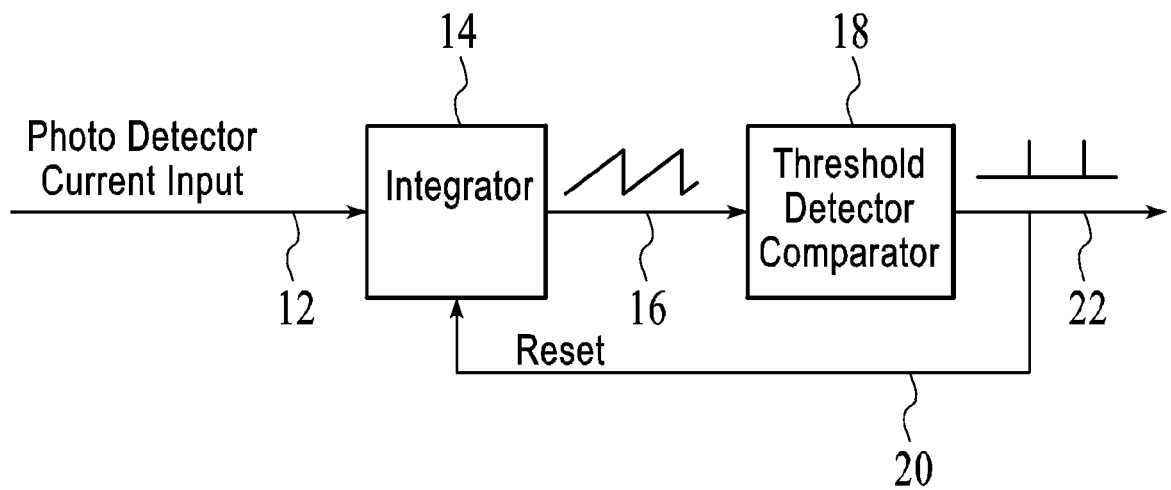
FIG. 2 is a block diagram of a typical current to frequency converter.
Figure 3:
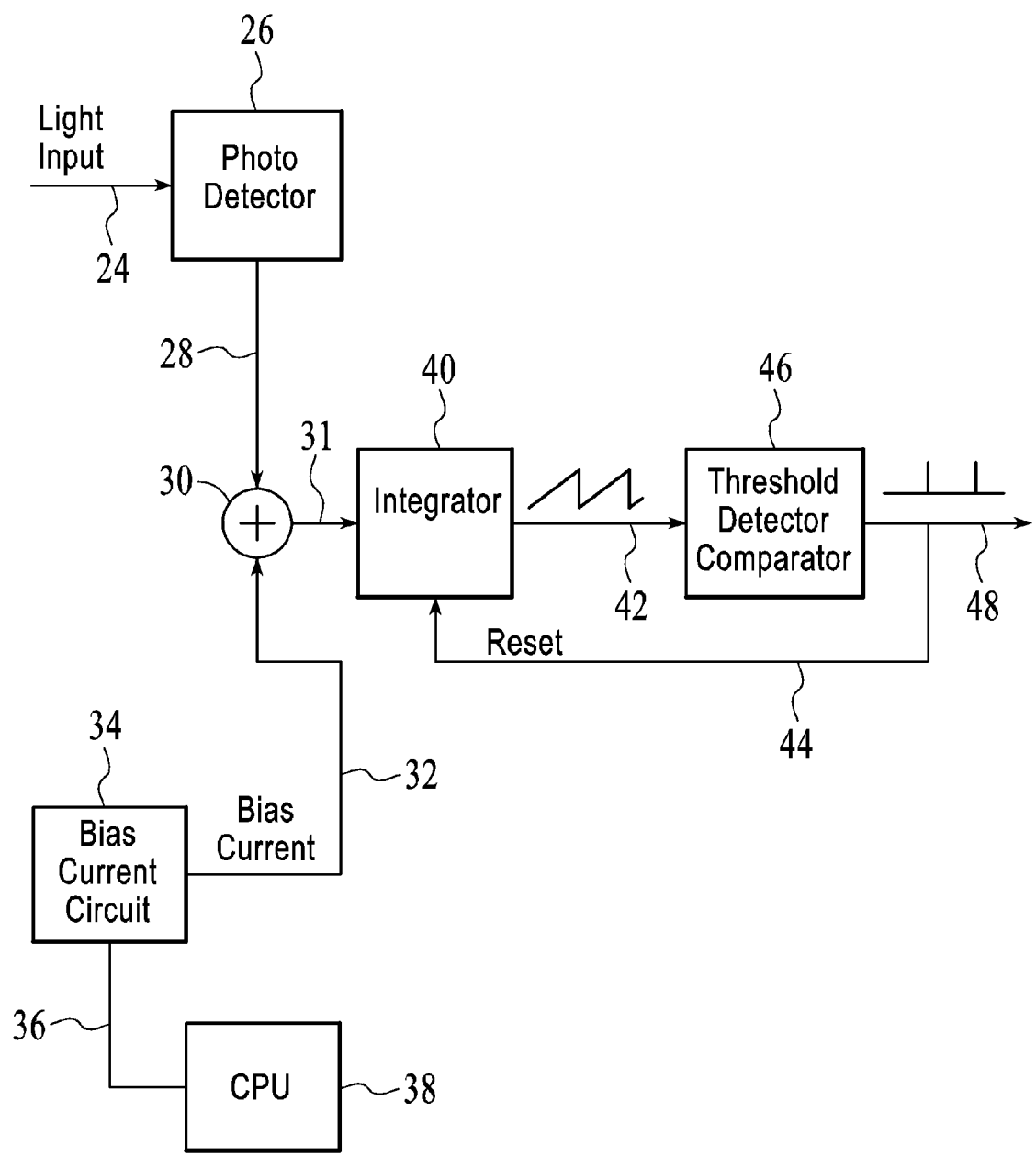
FIG. 3 is a block diagram of a preferred embodiment of a light to frequency converter sensing circuit in accordance with the present invention.

In a preferred embodiment of the present invention, however, the current to frequency converter has a current input parallel to the current input from the photo detector as shown in FIG. 3. As illustrated in FIG. 3, light is received via light input 24 and coupled to photo detector 26 (such as previously described herein or in the Referenced Patent Documents). Bias current circuit 34, under software control of CPU 28, provides bias current on line 32. Current from bias current circuit 34 on line 32 and current from photo detector 26 on line 28 are coupled to summer circuit 30. Summer circuit 30 may be of any conventional design such as is known in the art, and may be implemented with one or more operational amplifiers, transistors or other electronic elements. What is important is that summing circuit 30 sums the current from photo detector 26 and bias current circuit 34 and outputs a summed current on line 31 that is input to integrator 40. Integrator 40, line 42, threshold detector 46, reset line 44 and output line 48 are configured and operate in an analogous manner to the circuit illustrated in FIG. 2 and are not discussed further here. What is important is that the current from bias current circuit 34 provides an electronic bias to the current to frequency converter. When there is no light input to photo detector 26, photo detector 26 provides little or no current to integrator 40. The electronic bias current provided by bias current circuit 34 is set under control of CPU 38 via one or more signals on control line(s) 36, and preferably causes the current to frequency converter to maintain a minimal frequency output to ensure measurements can be made at minimal light intensities (see, e.g., the discussion of light bias in the Referenced Patent Documents, with the use of current bias as described herein used instead of light bias as in the Referenced Patent Documents, etc.). The minimal frequency can be considered a pseudo dark frequency. The current input to integrator 40 from bias current circuit 34 can be provided by a conventional bias current circuit, as will be apparent to those of skill in the art.

The bias current is adjustably provided via bias circuit 34 and can be increased or decreased under CPU control (see the Referenced Patent Documents regarding exemplary systems including CPU-type circuits for such control) to ensure that the LFC preferably produces at least two output pulses (or other desirable predetermined number) during the measurement time interval. As the time interval is decreased for more rapid measurements the current from bias current circuit 34 preferably is increased under control of CPU 38. Similarly, as the time interval is decreased for slower measurement rates the bias current preferably is decreased under control of CPU 38.

In preferred embodiments, light intensity measurements are made by determining the measurement rate and adjusting the bias current to produce at least two output pulses from the LFC in the measurement time interval. The sample light source, providing light that is returned from the material, object or sample under measurement and is present on light input 24, is turned off preferably under CPU control (see the Referenced Patent Documents) and the output of the LFC is measured with only the bias current. The sample light source is then applied and the output of the LFC is measured. The light intensity of the light from the light source and returned to light input 24 is then preferably determined by subtracting the bias frequency as shown in equation 2 above.

Figure 4:
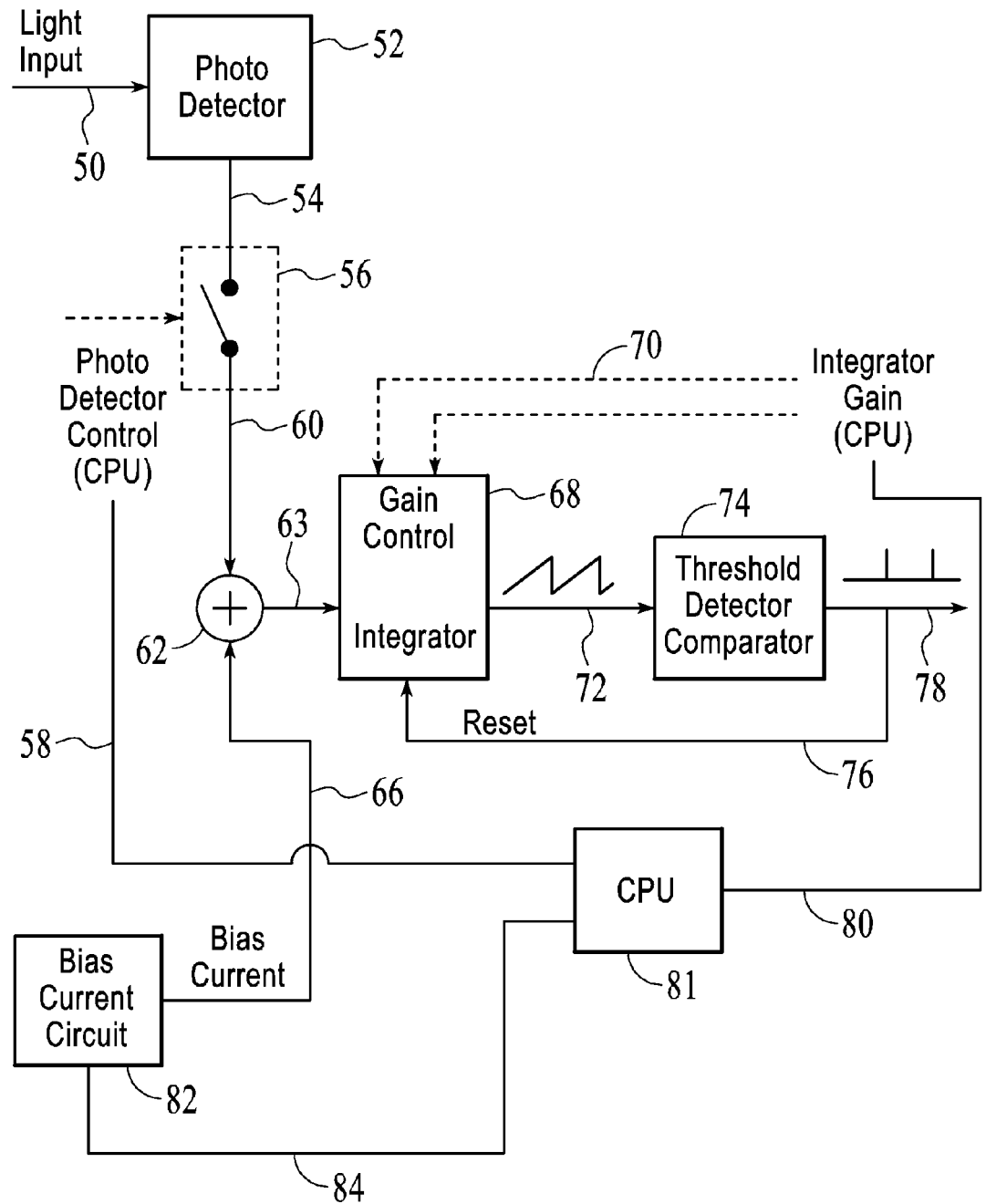
FIG. 4 is a block diagram of another preferred embodiment of a light to frequency converter sensing circuit with a light source gate and adjustable gain in accordance with the present invention.

FIG. 4 illustrates additional details of another preferred embodiment of the present invention. Light input 50, photo detector 52, summing circuit 61, bias current circuit 82, integrator 68, threshold detector comparator 74, output line 78, reset signal line 76 and lines 66, 63 and 84 are configured and operate in an analogous manner to the circuit illustrated in FIG. 3 and are not discussed further here. As illustrated in FIG. 4, however, in accordance with this alternative embodiment, light source photo detector 52 has an output line preferably coupled to electronic switch 56 as illustrated, which permits the output on line 54 from photo detector 52 to be enabled or disabled (i.e., coupled to or de-coupled from) from the current to frequency detector. Switch 56, preferably operating under control of CPU 81 via one or more signals on line(s) 58 and coupled to summing circuit 62 via line 60, allows the electronic bias current provided by bias current circuit 82 to be measured independently of the output current from photo detector 52 without gating the sample light source off with an external circuit. Measurements preferably are made in rapid succession under control of CPU 81 by gating off the current from photo detector 52 via switch 56, measuring the bias current provided via bias current circuit 82, gating on the current from photo detector 52 via switch 56, and then measuring both the bias and photo detector current and subtracting the bias frequency as disclosed in equation 2 above. As will be appreciated from the discussion herein and in the Referenced Patent Documents, such measurements may be made by counting the number of pulses on output 78, etc.

Also illustrated in FIG. 4 is a further enhancement of a light to frequency converter system used in certain alternative preferred embodiments of the present invention. As illustrated, integrator 68 in the current to frequency converter has an adjustable gain control provided by lines 70 that, for example, can be electronically controlled by varying the feedback capacitance by applying additional capacitance to the feedback loop (such additional, variable capacitance being illustrated by lines 70). As will be understood by those of skill in the art, under control of CPU 81 via signal line(s) 80, capacitance may be coupled such as by transistor or other electronic switch to integrator 68, which may preferably be an operational amplifier type integrator. By varying the capacitance under CPU control, integrator 68 may have a varying gain function. While in preferred embodiments an op-amp type integrator is disclosed, such that the gain may be varyied by varying feedback capacitance, in other embodiments other circuit arrangements for provided integrator gain control are utilized. What is importance is that, under CPU control, integrator gain may be varied. In accordance with such preferred embodiments, by varying the integrator gain, the output frequency of the light to frequency converter system can be lowered to prevent saturation of the frequency counters under high light intensity situations or raised when light intensities are low.

As will be appreciated based on the foregoing description in conjunction with the description in the Referenced Patent Documents, improved systems and methods are provided for optical sensing in numerous application. Also from the foregoing description and the Referenced Patent Documents, it will be understood that the present invention contemplates a plurality of improved optical sensors that may be integrated into a unitary arrangement and applied in numerous systems and methods. In particular, preferred embodiments of the present invention may be arranged so that a plurality of optical sensors are included on a single substrate, which may be a semiconductor wafer or a printed circuit board, where a plurality of filters are positioned above respective ones of the optical sensors (which may be bandpass interference filters deposited on the optical sensors or a separate substrate), such that the plurality of optical sensors and associated filters and control electronics implement spectrometers and/or spectrophotometers such as described in the Referenced Patent Documents. For purposes of confirmation, optical sensors in accordance with the present invention may be utilized for the light to frequency converters in the Referenced Patent Documents, and, for example, the use of light bias in the Referenced Patent Documents may be replaced with bias current provided via embodiments of the present invention. Such disclosures in the Referenced Patent Documents are hereby incorporated by reference.

Although the invention has been described in conjunction with specific preferred and other embodiments, it is evident that many substitutions, alternatives and variations will be apparent to those skilled in the art in light of the foregoing description. Accordingly, the invention is intended to embrace all of the alternatives and variations that fall within the spirit and scope of the appended claims. For example, it should be understood that, in accordance with the various alternative embodiments described herein, various systems, and uses and methods based on such systems, may be obtained. The various refinements and alternative and additional features also described may be combined to provide additional advantageous combinations and the like in accordance with the present invention. Also as will be understood by those skilled in the art based on the foregoing description, various aspects of the preferred embodiments may be used in various subcombinations to achieve at least certain of the benefits and attributes described herein, and such subcombinations also are within the scope of the present invention. All such refinements, enhancements and further uses of the present invention are within the scope of the present invention.

What is claimed is:

1. An optical sensor comprising:
a photo detector;
a bias current circuit;
a summing circuit summing electrical current from the photo detector and electrical current from the bias current circuit;
an integrator coupled to an output of the summing circuit; and
a threshold detector comparator circuit having an input coupled to the output of the integrator and an output providing a series of pulses;
wherein the series of pulses has a frequency based on light received by the photo detector and the electrical current from the bias current circuit.

2. A method comprising:
generating photo electrical current based on light received by a photo detector;
generating bias electrical current;
summing the bias electrical current and the photo electrical current to generate a summed electrical current, and coupling the summed electrical current to an integrator;
integrating the summed electrical current with the integrator; and
resetting the integrator when a voltage of the integrator reaches a threshold;
wherein a series of electrical pulses is generated at an output of the integrator, wherein the bias electrical current controls a minimum frequency of the series of electrical pulses.

* * * * *